(12) United States Patent
Hong et al.

(10) Patent No.: US 8,152,354 B2
(45) Date of Patent: Apr. 10, 2012

(54) LIGHT SOURCE UNIT, MANUFACTURING METHOD THEREOF, AND DISPLAY DEVICE HAVING THE SAME

(75) Inventors: Ki-Hyun Hong, Cheonan-si (KR); Hee-Won Ko, Seoul (KR); Sang-Kil Lee, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 812 days.

(21) Appl. No.: 12/262,373

(22) Filed: Oct. 31, 2008

(65) Prior Publication Data
US 2009/0185362 A1    Jul. 23, 2009

(30) Foreign Application Priority Data
Jan. 18, 2008 (KR) .................. 10-2008-0005646

(51) Int. Cl.
*F21V 7/04* (2006.01)

(52) U.S. Cl. .. 362/630; 362/97.3; 362/234; 362/249.02; 362/253; 362/613; 257/89; 257/98

(58) Field of Classification Search ........ 362/97.1–97.3, 362/227, 234, 249.02, 253, 545, 612–613, 362/630–631, 800; 257/89, 98
See application file for complete search history.

(56) References Cited

U.S. PATENT DOCUMENTS
2008/0035938 A1\* 2/2008 Mazzochette .................. 257/89
\* cited by examiner

*Primary Examiner* — Stephen F Husar
*Assistant Examiner* — Meghan Dunwiddie
(74) *Attorney, Agent, or Firm* — Cantor Colburn LLP

(57) ABSTRACT

A light source unit includes; a first base layer, a plurality of conductive pads disposed on the first base layer, a second base layer disposed on the first base layer and including a plurality of openings therein exposing the plurality of conductive pads, a wiring portion disposed on the second base layer, and a plurality of light source elements disposed on the plurality of conductive pads exposed by the plurality of openings in the second base layer.

23 Claims, 6 Drawing Sheets

LIGHT SOURCE UNIT, MANUFACTURING METHOD THEREOF, AND DISPLAY DEVICE HAVING THE SAME

This application claims priority to Korean Patent application No. 10-2008-0005646, filed on Jan. 18, 2008, and all the benefits accruing therefrom under 35 U.S.C. §119, the contents of which in its entirety are herein incorporated by reference.

BACKGROUND OF THE INVENTION

1. Field of the Invention

The present invention relates to a light source unit and a display device having the light source unit. More particularly, the present invention relates to a light source unit having light source elements with improved heat releasing efficiency by changing the structure of a printed circuit board (hereinafter, referred to as "PCB") equipped with the light source elements to reduce the distance between the light source elements and a receiving member where the PCB is attached, a method of manufacturing the light source unit, and a display device having the light source unit.

2. Description of the Related Art

Recently, flat panel display devices, such as liquid crystal display ("LCD") devices and plasma panel display devices, have rapidly developed, replacing cathode ray tube ("CRT") displays in many applications. However, an LCD requires a light source because it cannot produce light by itself. Therefore, LCDs are provided with a backlight unit under a liquid crystal display panel and display images using the light emitted from the backlight unit.

The backlight unit includes a light source. Light emitting diodes (hereinafter, referred to as "LEDs") have been commonly used as a backlight light source in recent years and an LED unit having a PCB on which the LEDs are mounted to reduce the weight and thickness of the backlight unit is used. According to PCBs equipped with LEDs in the related art, conductive pads are formed on a base layer and a wiring portion including power lines and grounding lines is formed beneath the base layer. Furthermore, an upper passivation layer and a lower passivation layer are formed on the conductive pad and the wiring portion, respectively, and LEDs are disposed on regions of the conductive pad exposed by removing portions of the upper passivation layer. The wiring portion and the LEDs are electrically connected through via holes formed in the base layer. An LED unit having the above configuration is attached to a receiving member, for example by a double-sided tape.

However, according to the configuration of the LED units in the related art, heat generated from the LEDs is not effectively transferred to the receiving member because the conductive pads, the wiring portion of the base layer, the lower passivation layer, and the double-side tape are provided between the LEDs and the receiving member. That is, because the distance between the LEDs and the lower receiving member is large, heat releasing efficiency of the LEDs is decreased, which may result in overheating and ultimately results in a reduced lifetime of the LEDs.

BRIEF SUMMARY OF THE INVENTION

An exemplary embodiment of the present invention provides a light source unit having improved heat releasing efficiency and a display device having the exemplary embodiment of a light source unit.

Exemplary embodiments of the present invention provide a light source unit having improved heat releasing efficiency by providing a PCB equipped with the light source elements having a substantially reduced distance between the light source elements and a receiving member.

An exemplary embodiment of a light source unit according to the present invention includes; a first base layer, a plurality of conductive pads disposed on the first base layer, a second base layer disposed on the first base layer and including a plurality of openings therein exposing the plurality of conductive pads, a wiring portion disposed on the second base layer, and a plurality of light source elements disposed on the plurality of conductive pads exposed by the plurality of openings in the second base layer.

Exemplary embodiments of the light source unit may further include; a first passivation layer disposed on the first base layer, and a second passivation layer disposed on the second base layer.

In one exemplary embodiment, the wiring portion may include at least one power line configured to supply power to the plurality of light source elements.

In one exemplary embodiment, the wiring portion may further include at least one grounding line configured to connect the plurality of light source elements with at least one grounding terminal.

In one exemplary embodiment, each of the conductive pads may have a width larger than a width of the at least one grounding line and the at least one grounding line may have a width larger than a width of the at least one power line.

In one exemplary embodiment, the light source unit may further include; a plurality of first connecting lines extending from a first group of conductive pads, and a plurality of second connecting lines extending from a second group of conductive pads.

In one exemplary embodiment, the light source unit may further include; a plurality of first via holes formed through the second base layer, wherein the first via holes are filled with a conductive material and connect the plurality of first connecting lines with the at least one power line, and a plurality of second via holes formed through the second base layer, wherein the second via holes are filled with a conductive material and connect the plurality of second connecting lines with the at least one grounding line.

In one exemplary embodiment, the light source unit may further include; plurality of first via holes formed through the second base layer, wherein the first via holes are filled with a conductive material and connect a conductive pad with the at least one power line, and a plurality of second via holes formed through the second base layer, wherein the second via holes are filled with a conductive material and connect another conductive pad with the at least one grounding line.

In one exemplary embodiment, the light source unit may further include at least one heat release pad disposed on the lower side of the conductive pad.

An exemplary embodiment of a method of manufacturing a light source unit according to the present invention includes; disposing a plurality of conductive pads on a first base layer, disposing a plurality of light source elements on the plurality of conductive pads, disposing a second base layer on the first base layer, and disposing a wiring portion on the second dbase layer, wherein the plurality of conductive pads are exposed through the second base layer.

In one exemplary embodiment, regions of the second base layer corresponding to the light source elements may be removed.

In another exemplary embodiment regions of the second base layer corresponding to the width of the light source elements may be entirely removed.

In one exemplary embodiment, the method may further include disposing a passivation layer on the second base layer, wherein the passivation layer is not disposed on the plurality of light source elements.

An exemplary embodiment of a display device according to the present invention includes; a display panel;

a light source unit configured to provide a light to the display panel, the light source unit including; a first base layer, a plurality of conductive pads disposed on the first base layer, a second base layer disposed on the first base layer and including a plurality of openings therein exposing the plurality of conductive pads, a wiring portion disposed on the first base layer, and a plurality of light source elements disposed on the plurality of conductive pads, and a receiving member wherein the light source unit is fixed.

In one exemplary embodiment, the wiring portion may include; at least one power line configured to apply power to the plurality of light source elements, and at least one grounding line configured to connect the plurality of light source elements with at least one grounding terminal.

In one exemplary embodiment, each of the plurality of conductive pads may have a width larger than the at least one grounding line and the at least one grounding line may have a width larger than the at least one power line.

In one exemplary embodiment, the display device may further include: a plurality of first connecting lines extending from a first group of the plurality of conductive pads, a plurality of second connecting lines extending from a second group of the plurality of conductive pads, a plurality of first via holes formed through the second base layer, wherein the first via holes are filled with a conductive material and connect the plurality of first connecting lines with the at least one power line, and a plurality of second via holes formed through the second base layer, wherein the second via holes are filled with a conductive material and connect the plurality of second connecting lines with the at least one grounding line.

In one exemplary embodiment, the display device may further include; a plurality of first via holes formed through the second base layer, wherein the first via holes are filled with a conductive material and connect a first group of conductive pads with the at least one power line, and a plurality of second via holes formed through the second base layer, wherein the second via holes are filled with a conductive material and connect a second group of conductive pads with the at least one grounding line.

In one exemplary embodiment, the display device may further include a heat-radiating adhesive configured to attach the light source unit to the receiving member.

In one exemplary embodiment, the heat-radiating adhesive may include a thermosetting material configured to maintain adhesiveness at a temperature correspond to an operating temperature of the light source elements.

In one exemplary embodiment, the light source unit may be attached on an inside of a side wall of the receiving member.

In one exemplary embodiment, the display device may further include; a light guide plate including a first side in contact with a side of the light source unit.

In one exemplary embodiment, the light source unit may be attached to an interior bottom side the receiving member.

BRIEF DESCRIPTION OF THE DRAWINGS

The above and other aspects, features and advantages of the present invention will become more readily apparent by describing in further detail exemplary embodiments thereof with reference to the attached drawings in which.

DETAILED DESCRIPTION OF THE INVENTION

Figure 1:
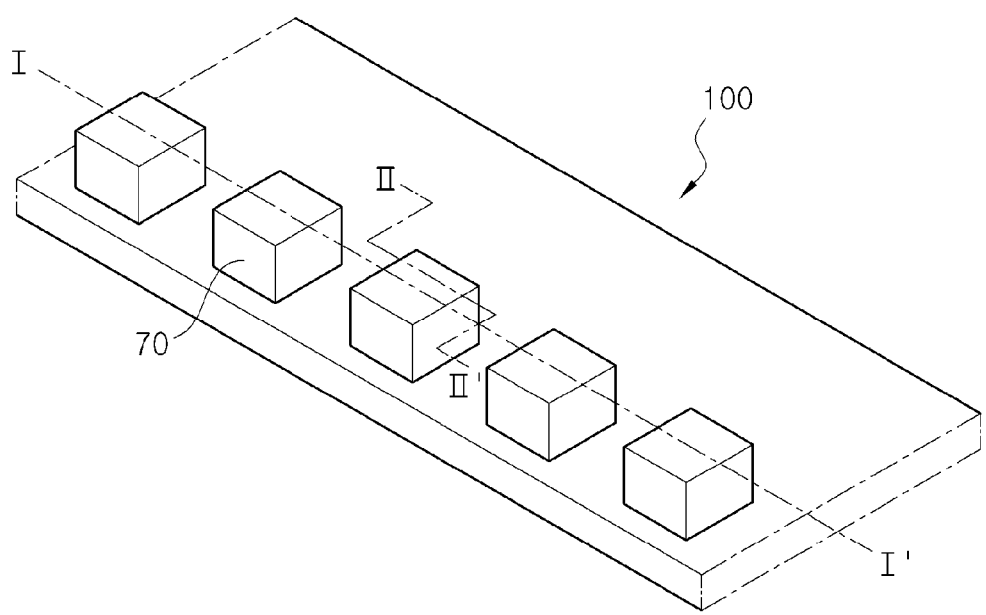
FIG. 1 is a schematic perspective view of an exemplary embodiment of a light source unit according to the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Hereinafter, the present invention will be described in detail with reference to the accompanying drawings.

Figure 2:
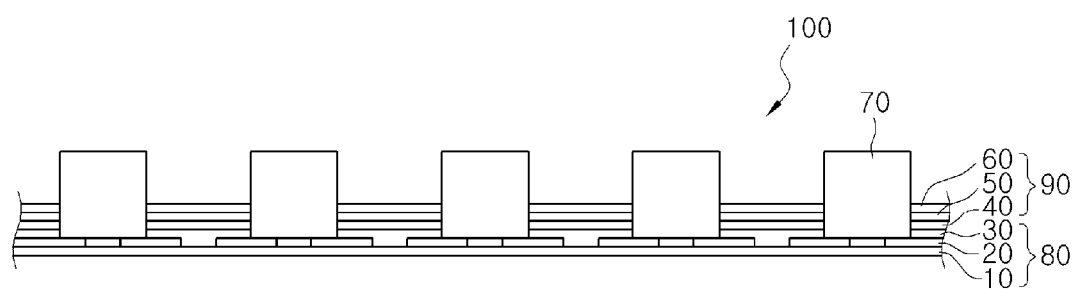
FIG. 2 is a schematic cross-sectional view of the exemplary embodiment of a light source unit taken along line I'-I' of FIG. 1.

FIG. 1 is a schematic perspective view of an exemplary embodiment of a light source unit according to the present invention and FIG. 2 is a schematic cross-sectional view of the exemplary embodiment of a light source unit taken along line I'-I' of FIG. 1. Furthermore, FIG. 3 is a schematic top plan view of an exemplary embodiment of a light source unit according to the present invention and FIG. 4 is a cross-sectional view taken along line II-II' of FIGS. 1 and 3.

Referring to FIGS. 1, 2, 3 and 4, an exemplary embodiment of a light source unit 100 according to the present invention includes a plurality of light source elements 70, exemplary embodiments of which include LEDs, a first PCB 80 equipped with the light source elements 70, and a second PCB 90 having a wiring portion 50 to drive the light source elements 70. In the present exemplary embodiment, the second PCB 90 is stacked on the first PCB 80. That is, as shown in FIG. 2, the first PCB 80 includes a first base layer 10, a plurality of conductive pads 20 formed of a conductive material on the first base layer 10, and a first passivation layer 30 formed on the first base layer 10 to protect the conductive pads 20. The light source elements 70 are mounted on the plurality of conductive pads 20.

Furthermore, as shown in FIG. 2, the second PCB 80 includes a second base layer 40, a wiring portion 50 formed of a conductive material on the second base layer 40, and a second passivation layer 60 formed on the second base layer 40 to protect the wiring portion 50. An electric signal from the outside is applied to the wiring portion 50. Furthermore, as shown in FIGS. 3 and 4, connecting lines 21 and 22, which extend from the conductive pads 20, are formed to electrically connect with the wiring portion 50 through via holes 41. In one exemplary embodiment, the via holes 41 are filled with a conductive material.

Figure 3:
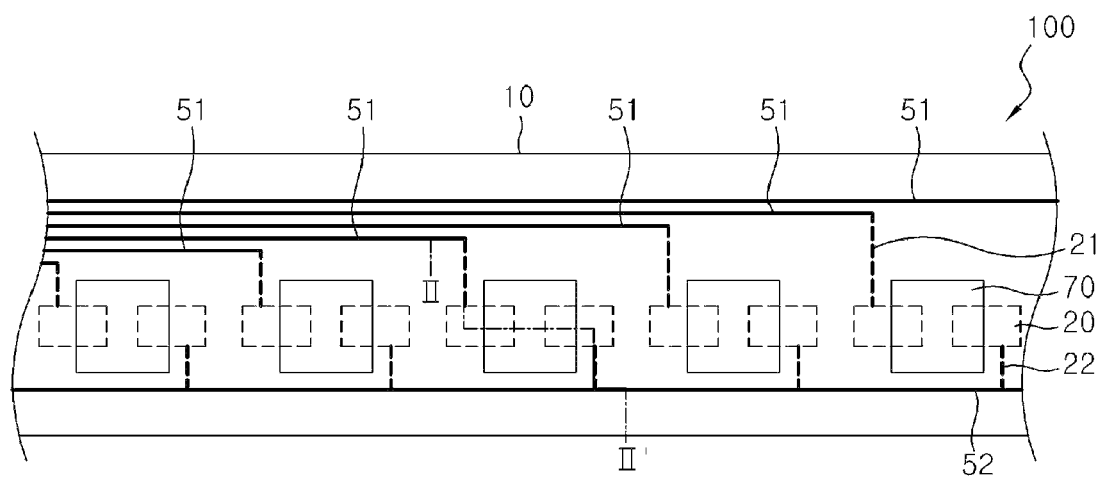
FIG. 3 is a schematic top plan view of an exemplary embodiment of a light source unit according to the present invention.
Figure 4:
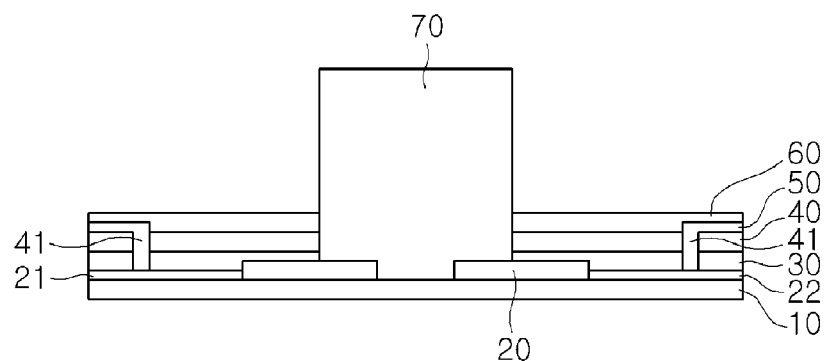
FIG. 4 is a schematic cross-sectional view taken along line II-II' of FIGS. 1 and 3.

FIG. 3 is a schematic top plan view with the second passivation layer 60 removed in order to show the elements below. In the exemplary embodiment shown in FIG. 3 the light source elements 70, a power line 51 and a grounding line 52, which are visible because the second passivation layer 60 is removed, are indicated by solid lines, and the conductive pad 20 and the first and second connecting lines 21, 22, which are formed under the light source elements 70, the power line 51, and the grounding line 52, are indicated by dotted lines.

In one exemplary embodiment, the first and second base layers 10 and 40, respectively, may be formed of polyester, polyimide, fluororesin, or other materials with similar characteristics, in order to provide flexibility. Furthermore, alternative exemplary embodiments may provide rigidity by adding a reinforcing agent or filler with an epoxy resin and a bismaleimide triazine resin, or applying a metallic material to the base layers 10 or 40. By further providing a metallic material, it may be possible to further improve the strength and heat release properties of the light source unit 100.

In one exemplary embodiment, the conductive pads 20 and the wiring portion 50 may be formed by the printing a conductive material on the first base layer 10 and the second base layer 40, respectively. The conductive pads 20 and the wiring portion 50 may be formed from a material which is both thermally and electrically conductive. In one exemplary embodiment, the conductive pads 20 have a higher thermal conductivity than the first base layer 10.

In one exemplary embodiment, the first and second passivation layers 30 and 60 may be formed of a polyimide film, a polyester film, or substantially the same material as the first and second base layers 10 and 40. Alternative exemplary embodiments include configurations wherein the second passivation layer 60 may be formed of a reflective material or a non-reflective material coated with a reflective material, such that it is possible to improve light emitting efficiency of the light source unit 100 by reflecting light from the light source elements 70.

As shown in FIGS. 2 and 4, the wiring portion 50 is formed on the second base layer 40, except for the regions where the light source elements 70 are disposed, in order to not overlap the light source elements 70. Furthermore, as shown in FIG. 3, the wiring portion 50 includes at least one power line 51 for supplying power to a terminal of the light source element 70 and at least one grounding line 52 for connecting the other terminal of the light source element 70 with a grounding terminal. In one exemplary embodiment, the power line 51 and the grounding line 52 may be formed as a single unitary element connected to each and every light source element 70. Alternative exemplary embodiments include configurations wherein a plurality of power lines 51 or grounding lines 52 may be formed so that each light source element 70 is connected to an individual power line 51, grounding line 52 or both. Another alternative exemplary embodiment includes a configuration wherein the light source elements 70 are connected to the power lines 51 or grounding lines 52 in blocks, so that a predetermined number of light source elements 70 may be simultaneously activated by an individual power line 51. In the exemplary embodiment wherein a plurality of power lines 51 or grounding lines 52 are formed so that each light source element 70 is connected to an individual power line 51, the lengths of each of the power lines 51 or grounding lines 52 may be different.

In the exemplary embodiment shown in FIG. 3, the plurality of power lines 51 are formed so that each light source elements 70 is connected to an individual power line having a different length, and one grounding line 52 is formed connected to each of the light source elements 70.

In one exemplary embodiment, the grounding line 52 may have a width larger than each of the individual power lines 51 for increased heat release efficiency. In addition, the plurality of conductive pads 20 may have a width larger than the grounding line 52. Therefore, in one exemplary embodiment, the plurality of conductive pads 20 have the largest width followed by the grounding line 52 and the power line 51. When the plurality of conductive pads 20 and the grounding line 52 have large widths as described above, the heat from the light source elements 70 can be more efficiently transferred, thereby improving heat release characteristics of the light source unit 100.

Furthermore, as shown in FIGS. 2 and 4, the light source elements 70 are mounted on the conductive pads 20, at least portions of which are exposed by removing portions of the second passivation layer 60, the second base layer 40, and the first passivation layer 30. As shown in FIG. 3, one light source element 70 is mounted on two conductive pads 20 at the same time, in which one of the conductive pads 20 is connected with the power line 51 and the other is connected with the grounding line 52.

As shown in FIGS. 3 and 4, the first connecting line 21 is formed to connect the conductive pad 20 with the power line 51. The power line 51 is connected with the first connecting line 21 through the via hole 41 filled with a conductive material. Similarly, as shown in FIGS. 3 and 4, the second connecting line 22 is formed to connect the conductive pad 20 to the grounding line 52. The grounding line 52 is connected with the second connecting line 22 through the via hole 41 filled with a conductive material. In this exemplary embodiment, the via hole 41 passes through a predetermined region of the second base layer 40 and the first passivation layer 30.

In one exemplary embodiment, an LED that emits white light is used as the light source element 70. In such an exemplary embodiment, the white light may be emitted by applying a fluorescent material to a light emitting chip that emits one of red, green, and blue light.

According to another exemplary embodiment, the conductive pads 20 and the power lines 51, or the conductive pads 20 and the grounding line 52 may be formed on substantially the same layer. That is, in one exemplary embodiment, the conductive pads 20 and the power lines 51 or the grounding line 52 may be formed directly on the first base layer 10. It is possible to improve characteristics of heat transfer when the conductive pads 20 and the grounding line 52 are formed on the first base layer 10 as shown in FIG. 5.

Figure 5:
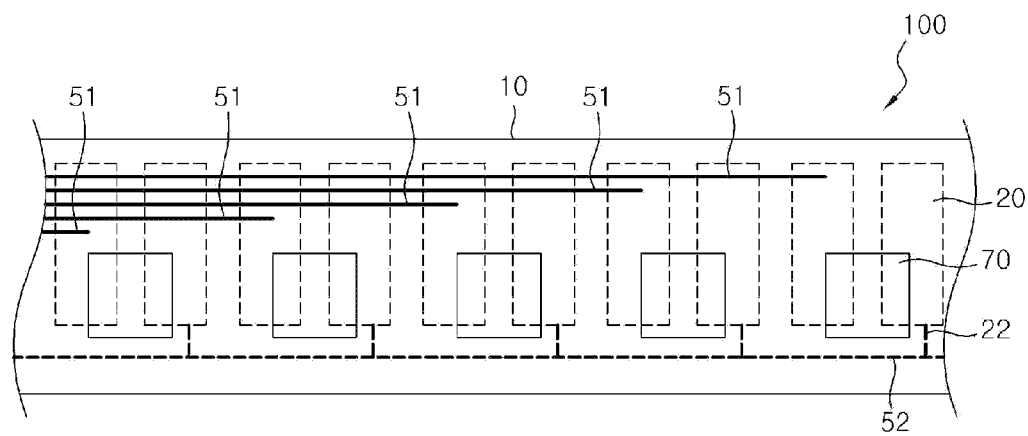
FIG. 5 is a schematic top plan view of another exemplary embodiment of a light source unit according to the present invention.

FIG. 5 is a schematic top plan view of such an alternative exemplary embodiment of a light source unit according to the present invention, with the second passivation layer 60 removed, in which the power lines 51 formed on the second base layer 40 are indicated by solid lines, and the conductive pads 20, the connecting lines 22, and the grounding line 52 on the first base layer 20 are indicated by dotted lines. In one exemplary embodiment wherein the conductive pads 20 are formed on the first base layer 10, the conductive pads 20 may have widths in one direction as wide as the entire width of the power lines 51 formed on the second base layer 40. In such an exemplary embodiment via holes (not shown) may be formed such that the conductive pads 20 are exposed through the second base layer 40 and the first passivation layer 30.

Therefore, the conductive pads 20 may be connected with the power lines 51 without forming the first connecting lines of the previously described exemplary embodiment. Furthermore, heat release pads (not shown) having widths larger than the conductive pads 20 may be formed under the conductive pads 20 to further improve the heat releasing characteristics of the light source unit 100.

Furthermore, according to an exemplary embodiment of a method of manufacturing the exemplary embodiments of a light source unit 100 according to the present invention, the first passivation layer 30, the second base layer 40, and the second passivation layer 60 are stacked on the first base layer 10 provided with the conductive pads 20 thereon. Regions of the first passivation layer 30, the second base layer 40, and the second passivation layer 60 corresponding to the light source elements 70 are removed before installation of the light source elements 70. That is, the light source elements 70 are mounted on the conductive pads 20 formed on the first base layer 10 and then the first passivation layer 30, the second base layer 40, and the second passivation layer 60 are stacked on the first base layer 10.

According to another exemplary embodiment of a method of manufacturing exemplary embodiments of the light source unit 100, first the light source elements 70 are mounted on the conductive pads 20 formed on the first base layer 10. Then, the first passivation layer 30 and the second bases layer 40, having regions corresponding to the width of the light source elements 70 removed in a line shape, are stacked on the first base layer 10, and then the second passivation layer 60, in which the regions corresponding to the light source elements 70 are selectively removed, may be stacked on the second base layer 40.

Alternative exemplary embodiments include manufacturing methods wherein only the regions of the first passivation layer 30 and the second passivation layer 60 which correspond to the light source elements 70 may be removed, and the regions of the second base layer 40 that correspond to the light source elements 70 may be removed in a line shape. In such an exemplary embodiment, the light source elements 70 may be mounted on the conductive pads 20 on the first base layer 10, and then the first passivation layer 30, the second base layer 40, and the second passivation layer 60 may be stacked on the base layer 10. Alternative exemplary embodiments include other manufacturing methods as would be known to one of ordinary skill in the art.

In the above described exemplary embodiments of a light source unit 100 according to the present invention, the light source elements 70 are mounted on the conductive pads 20 formed on the first PCB 80, and the wiring portion 50 formed on the second PCB 90 may be connected with the conductive pads 20 through the via holes 41 and the first and second connecting lines 21, 22, when present. However, as briefly described above, the present invention is not limited to the above configuration, specifically, exemplary embodiments also include configurations wherein the conductive pads 20 and the wiring portion 50 may be formed on the same layer. Such an embodiment is described hereafter with reference to FIGS. 6 and 7.

Figure 6:
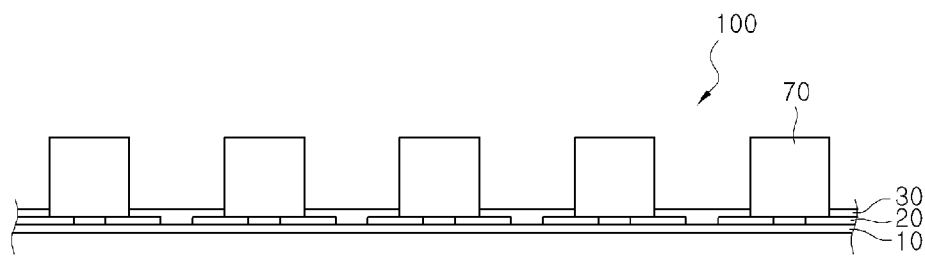
FIG. 6 is a schematic cross-sectional view of another exemplary embodiment of a light source unit according to the present invention.
Figure 7:
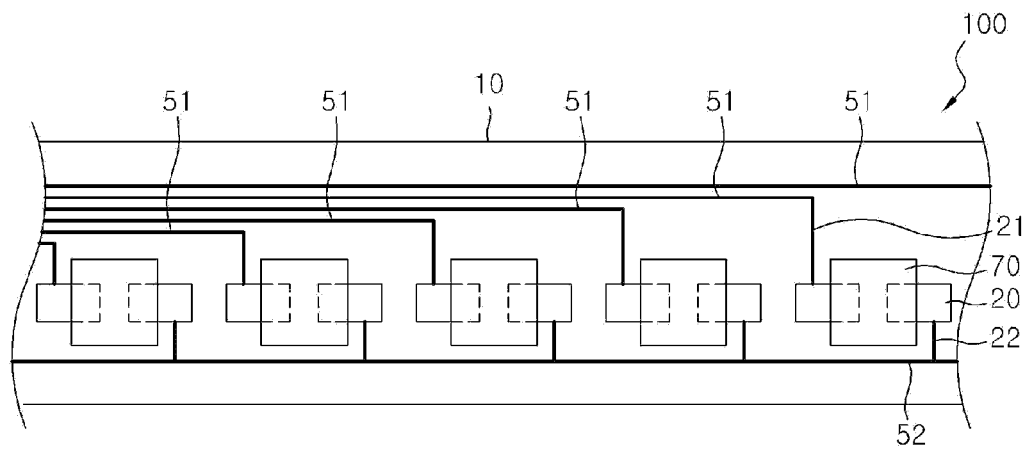
FIG. 7 is a schematic top plan view of another exemplary embodiment of a light source unit according to the present invention.

FIG. 6 is a schematic cross-sectional view of another exemplary embodiment of a light source unit according to the present invention and FIG. 7 is a schematic top plan view of another exemplary embodiment of a light source unit according to the present invention, in which conductive pads and a wiring portion are formed on the same layer.

Referring to FIGS. 6 and 7, an exemplary embodiment of a light source unit 100 according to the present invention includes a flexible base layer 10, a plurality of conductive pads 20 spaced apart from each other on the base layer 10, a wiring portion 50 spaced apart from the conductive pads 20 on the base layer 10, and a passivation layer 30 formed on the base layer 10 to protect the conductive pads 20 and the wiring portion 50. The present exemplary embodiment is similar to the previously described exemplary embodiment of FIGS. 1-4 except for the disposition of the wiring portion 50 on the first base layer 10. In such an exemplary embodiment, the power line 51 and the grounding line 52 are formed at predetermined regions that are spaced apart in the opposite directions from the regions where the light source elements 70 are mounted.

One light source element 70 is connected with two conductive pads 20, in which one of the conductive pads 20 is connected with the power line 51 and the other is connected with the grounding line 52. A first connecting line 21 that extends from the power line 51 is formed to connect one of the conductive pads 20 with the power line 51 and a second connecting line 22 that extends from the grounding line 52 is formed to connect the other conductive pad 20 with the grounding line 52. In one exemplary embodiment, the conductive pads 20 may have widths larger than the grounding line 52 and the grounding line 52 may have a width larger than the power line 51.

The exemplary embodiment of a light source unit 100 may be used in an edge light type or a direct light type backlight unit. An exemplary embodiment of an edge light type backlight unit is described in detail with reference to FIGS. 8-10 and an exemplary embodiment of a direct light type backlight unit is described in detail with reference to FIG. 11

Figure 8:
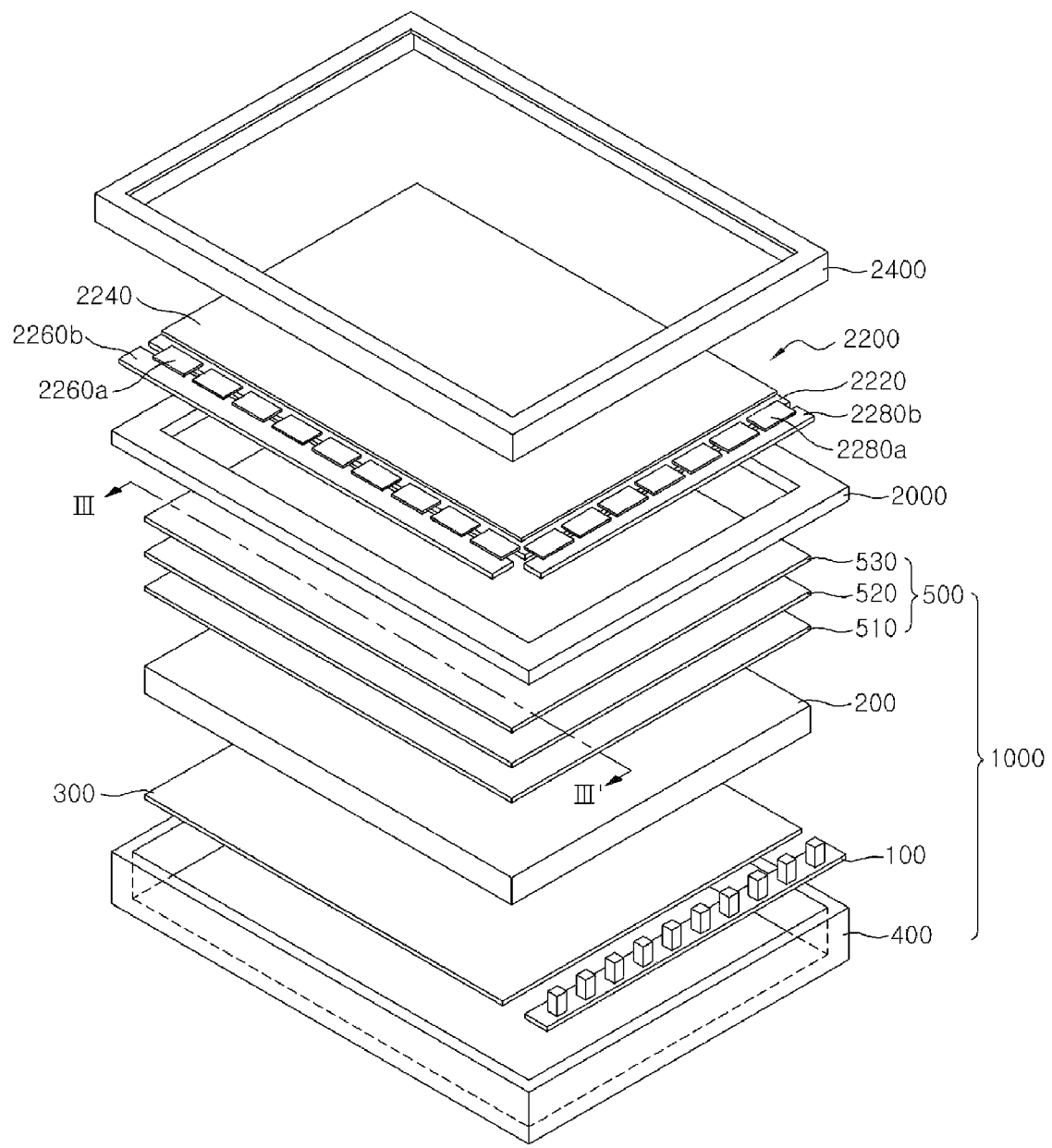
FIG. 8 is an exploded front perspective view of an exemplary embodiment of a liquid crystal display ("LCD") device having a backlight unit, using an exemplary embodiment of a light source unit according to the present invention.
Figure 9:
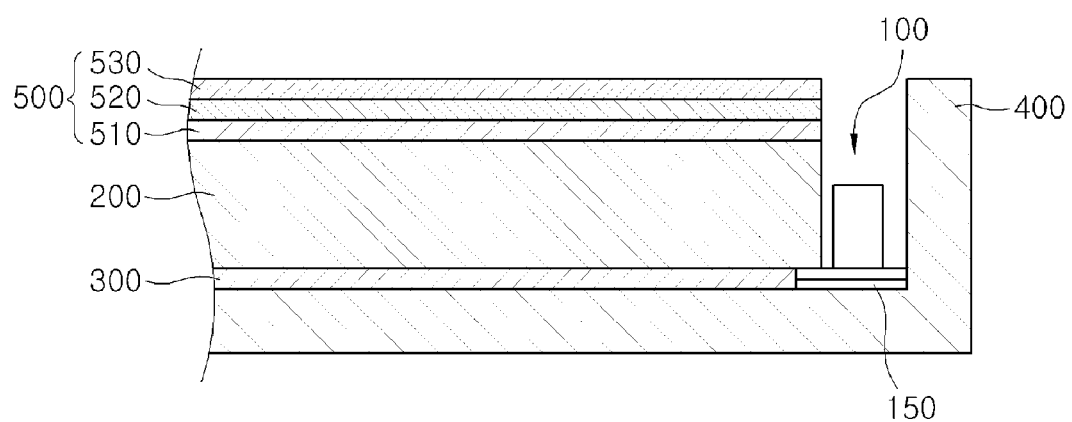
FIG. 9 is a partial cross-sectional assembly view taken along the line III-III' of FIG. 8.
Figure 10:
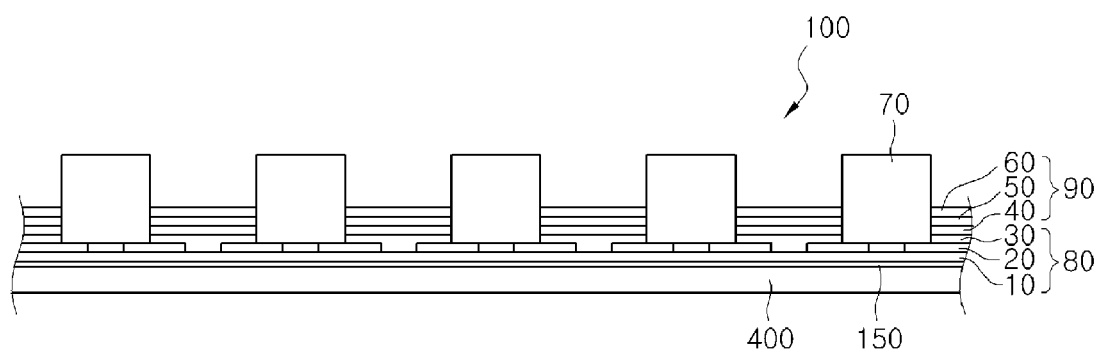
FIG. 10 is a partial enlarged cross-sectional view illustrating a combination of an exemplary embodiment of a light source and an exemplary embodiment of a lower receiving member as shown in FIG. 8.

FIG. 8 is an exploded front perspective view of an exemplary embodiment of an "LCD" device including an edge light type backlight unit using an exemplary embodiment of a light source according to the present invention, FIG. 9 is a partial cross-sectional view taken along the line III-III' of FIG. 8, and FIG. 10 is a partial enlarged cross-sectional view illustrating a combination of the exemplary embodiment of a light source unit and the exemplary embodiment of a lower receiving member shown in FIG. 8.

Referring to FIGS. 8, 9 and 10, an exemplary embodiment of a liquid crystal display ("LCD") device according to the present invention includes an LCD panel 2200, a backlight unit 1000, a mold frame 2000 that receives the backlight unit 1000, and an upper receiving member 2400 which covers a predetermined upper region and side of the backlight unit 1000.

The LCD panel 2200 includes a thin film transistor ("TFT") substrate 2220, data-sided and gate-sided tape carrier packages ("TCPs") 2260a and 2280a, respectively, which are connected to the TFT substrate 2220, data-sided and gate-sided printed circuit boards 2260b and 2280b, respectively which are respectively connected to the data-sided and gate-sided tape carrier packages 2260a, 2280a, a color filter substrate 2240 corresponding to the TFT substrate 2220, and a liquid crystal layer (not shown) interposed between the TFT substrate 2220 and the color filter substrate 2240. Exemplary embodiments also include configurations wherein the liquid crystal display panel 2200 may further include a polarizing plate (not shown) which is respectively formed on the color filter substrate 2240 and under the TFT substrate 2220.

In one exemplary embodiment, the TFT substrate 2220 is a transparent glass substrate with matrix-shaped TFTs and pixel electrodes. In such an exemplary embodiment data lines may be connected to source terminals of the TFTs and gate lines may be connected to gate terminals of the TFTs. In such an exemplary embodiment, pixel electrodes formed of transparent electrodes composed of transparent conductive material are connected to drain terminals of the TFTs. When electric signals are applied to the data lines and the gate lines, each TFT turns on or off, such that electric signals for forming an electric field between the pixel electrode and a common electrode (not shown) disposed on the CF substrate 2240 are transmitted to the drain terminal of each TFT.

The color filter substrate 2240 is a substrate having color pixels making a predetermined color when light passes therethrough. In one exemplary embodiment, the color filter substrate 2240 includes red (R), green (G), and blue (B) pixels which may be formed by a thin film process. A common electrode (not shown) may be formed on the entire surface of the color filter substrate 2240. Alternative exemplary embodiments include configurations wherein a plurality of common electrodes may be formed on the color filter substrate 2240. Exemplary embodiments of the color filter substrate 2240 may be formed from a transparent conductive thin film formed of a transparent conductive material such as Indium Tin Oxide ("ITO") or Indium Zinc Oxide ("IZO").

The backlight unit 1000 includes a light guide plate 200, a light source unit 100, and a reflective sheet 300. The light guide plate 200 changes the light from the light source unit into a planarized light and vertically transmits the light toward the liquid crystal display panel 2200. In the present exemplary embodiment, the light source unit 100 emits light to a side of the light guide plate 200 and is attached to a side of a lower receiving member 400 by a heat-radiating adhesive 150. The reflective sheet 300 is disposed under the light guide plate 200 and reflects light leaking through the lower side of the light guide plate 200. A reflector (not shown) may be further provided at least in a region between the light source unit 100 and the lower receiving member 400 to prevent leakage of the light emitted from the light source unit 100, or may be included in the lower receiving member 400 itself. In one exemplary embodiment light from the light source unit 100 may be directed into the light guide plate 200 by coating the inside of the lower receiving member 400 with a reflector film.

In one exemplary embodiment, the backlight unit 1000 further includes optical sheets 500 including a diffusion sheet 510 disposed on the light guide plate 200, a prism sheet 520 and a protecting sheet 530. In addition, the backlight unit 1000 further includes the lower receiving member 400 which receives the light guide plate 200, the light source unit 100, the reflective sheet 300, the optical sheets 500 and the light source unit 100 attached to the inside by the heat-radiating adhesive 150.

In the present exemplary embodiment, the light source unit 100 includes a plurality of light source elements 70, a first PCB 80 equipped with the light source elements 70 and a second PCB 90 where a wiring portion 50 that drives the light source elements 70 is formed. In the present exemplary embodiment, the second PCB 90 is stacked on the first PCB 80. That is, in the light source unit 100, a first base film 10, conductive pads 20, a first passive film 30, a second passive film 40, the wiring portion 50 and a second passive film 60 are layered, and the conductive pads 20 are exposed to mount the light source elements 70. Furthermore, the exemplary embodiment of a light source unit 100 may have an alternative configuration in which the conductive pads 20 and the wiring portion 50, and first and second connecting lines 21, 22 are formed on the base film 10, and the light source elements 70 are mounted on the conductive pads 20.

Exemplary embodiments of the light guide plate 200 which changes the light emitted from the light source unit 100 into planarized light is usually formed of a transparent material having a substantially constant index of refraction, exemplary embodiments of which include acryl resin (e.g. polymethyl metacrylate), polyolefin, polycarbonate or other materials with similar characteristics. In one exemplary embodiment, a prism pattern may be formed on the surface of the light guide plate 200 through which the light emitted from the light source unit 100 passes. Furthermore, a light path changing means that changes the light into planarized light by changing the light path through dispersion or diffraction, may be formed on the bottom of the light guide plate 200. Alternative exemplary embodiments of the light path changing means include a diffusion pattern diffusing the light, a hologram pattern diffracting the light, or a prism pattern concentrating the light. In one exemplary embodiment, the light path changing means may formed by printing or mechanical machining.

The reflective sheet 300 disposed under the light guide plate 200 improves light availability by reflecting the light leaking through the lower side of the light guide plate 200.

The optical sheets 500 may include the diffusion sheet 510, the prism sheet 520, and the protecting sheet 530 to improve quality and efficiency of the light passing through the light guide plate 200. Disposed on the light guide plate 200, the diffusion sheet 510 increases a front viewing angle of the LCD panel 2200 and attenuates dispersal of brilliant spots, bright lines, and spots by uniformly dispersing the light emitted from the plurality of light source elements 70. In one exemplary embodiment, the diffusion sheet 510 may be formed of a polycarbonate resin, a polyester resin or a component with similar characteristics.

The prism sheet 520 increases the luminance of the light passing through the diffusion sheet 510 by refracting and concentrating the light and then transmitting the light into the LCD panel 2200. In one exemplary embodiment, the prism sheet 520 is formed by providing stripes of micro-prism on a parent material, exemplary embodiments of which include polyester, and may be used in a set of horizontal and vertical sheets of prisms.

The protecting sheet 530 is disposed on the prism sheet 520 and protects the prism sheet 520 from abrasion and other physical degradation.

The lower receiving member 400 covers and protects the sides and the bottom of the light source unit 100. The lower receiving member 400 also covers and protects the light guide plate 200. In one exemplary embodiment, is the lower receiving member 400 may be formed in a box shape having a receiving space of a predetermined depth and an open upper side. In such an exemplary embodiment, the lower receiving member 400 may include a bottom and four sides extending from the bottom. The light source unit 100 may be attached to the inside of the lower receiving member 400 by the heat-radiating adhesive 150. That is, the light source unit 100 may be attached to the bottom, along an edge where the bottom meets a side of the lower receiving member 400. Furthermore, the light source unit 100 may be attached on the inside of one side wall of the lower receiving member 400.

In one exemplary embodiment, the heat-radiating adhesive 150 may be formed of a silicon-based or a polyimide silicon-based thermosetting material or other materials with similar characteristics. Furthermore, the heat-radiating adhesive 150 may have a good adhesive property to metallic materials and may be preferably made of a material having sufficient heat resistance to not be degraded by the heat from the light source elements 70 (e.g. the light source elements 70 may have an operating temperature of about 70° C. for LED). In one exemplary embodiment, a heat-radiating adhesive 150 may be resistant to temperatures of up to about 150° C. In one exemplary embodiment, a mono liquid type material that does not need a hardener, or a double liquid type material that may require a hardener, may be used for the heat-radiating adhesive 150. In an alternative exemplary embodiment a thermosetting material may be used. Therefore, the heat from the light source elements 70 of the light source unit 100 may be directly transferred to the lower receiving member 400 through the heat-radiating adhesive 150 and discharged to an outside of the lower receiving container 400. In one exemplary embodiment, the lower receiving member 400 may be made of a highly heat-conductive material, exemplary embodiments of which may include a metallic material, to smoothly and efficiently transfer the heat of the light unit 100

In one exemplary embodiment, the mold frame 2000 may be a rectangular frame composed of a bottom-plane and sides vertically extending from the bottom-plane. A seat for the LCD panel 2200 may be formed on the bottom-plane. In one exemplary embodiment, the seat may have fixing protrusions (not shown) to arrange the sides of the liquid crystal display panel 2200 by contacting with the sides. In an alternative exemplary embodiment the seat of the bottom-plane may have steps of a predetermined size to retain the LCD panel 2200.

In one exemplary embodiment, the light guide plate 200 and the optical sheets 500 may be fixed to the extending sides of the mold frame 2000. Portions of the extending sides of the mold frame 2000, that is, portions of the sides corresponding to the light source unit 100 may be removed such that they do not contact with the light source unit 100 attached to the lower receiving member 400.

In one exemplary embodiment, the upper receiving member 2400 may be a frame, similar to a window frame, which is composed of a top-plane and sides vertically extending from the top-plane. The lower portion of the top-plane of the upper receiving member 2400 supports a portion of the edge of the LCD panel 2200 and the sides are combined with the sides of the lower receiving member 400. In one exemplary embodiment, the upper receiving member 2400 may include a low-density metal which has high strength and is not easily deformed, one exemplary embodiment of which is Aluminum (Al).

The exemplary embodiment of an LCD panel 2200 shown in FIG. 8 includes an edge light type backlight unit in which the light source unit 100 is attached at a side on the bottom of the lower receiving member 400 and arranged corresponding to a side of the light guide plate 200. According to this configuration a side illumination type LED may be used in the light source unit 100. However, alternative exemplary embodiments include configurations wherein the light source unit 100 may be attached on the inside of a side wall of the lower receiving member 400. In such an alternative exemplary embodiment a top illumination type LED may be used in the light source unit 100.

Figure 11:
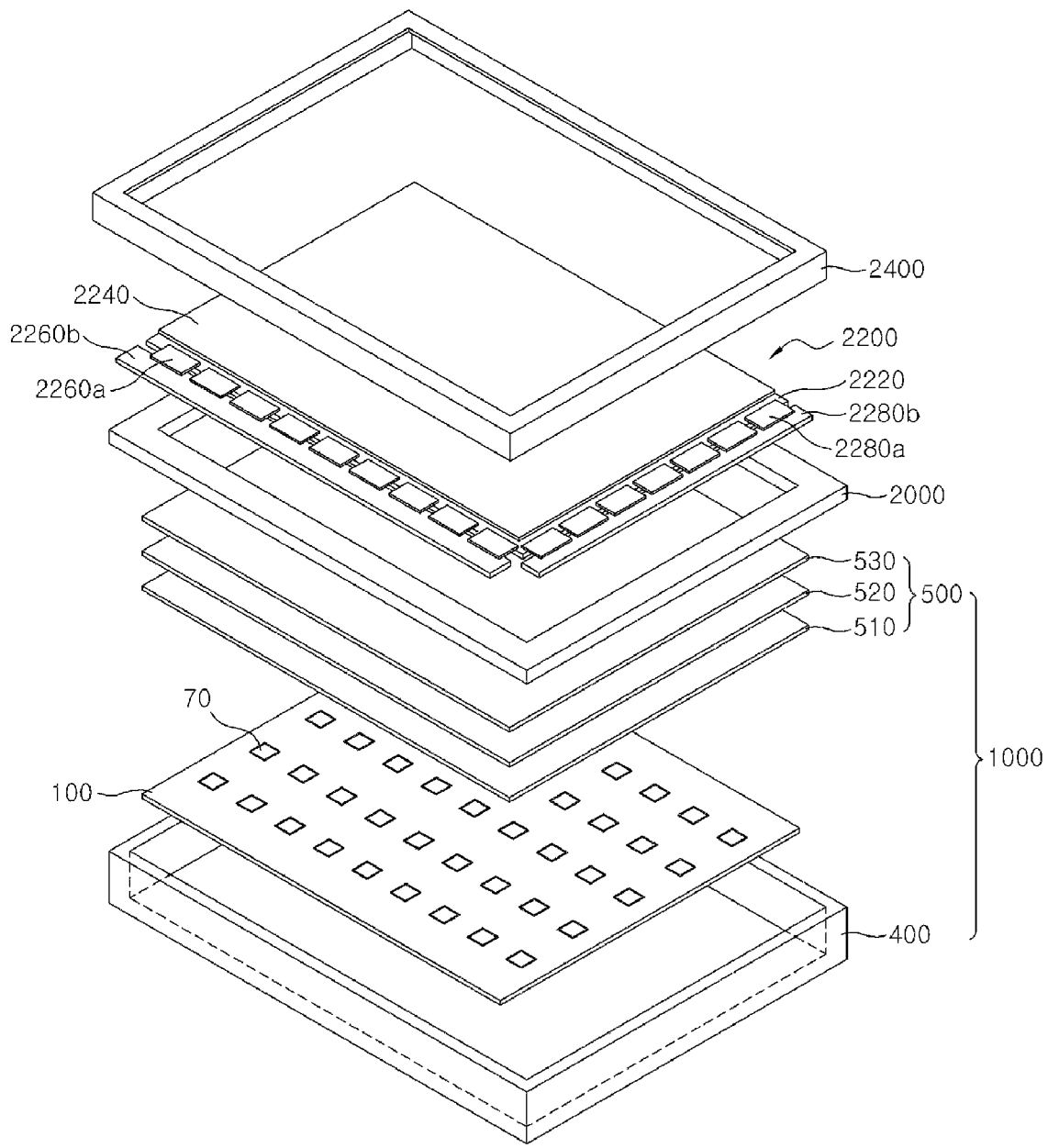
FIG. 11 is an exploded front perspective view of an LCD panel having another exemplary embodiment of a backlight unit using another exemplary embodiment of a light source according to the present invention.

In one exemplary embodiment a direct light type backlight including the light source unit 100 entirely attached on the lower side of the lower receiving member 400 may be used, in which the light guide plate 200 may be modified or omitted. An LCD panel 2200 including a direct light type backlight unit is shown in FIG. 11. In the light source unit 100 used as the direct light type backlight unit, a plurality of light source elements 70 of the lower receiving member 400 may be arranged in a matrix arrangement having rows and columns on a planar light source unit 100. Light source elements 70 arranged in one line or row may share a wiring portion, e.g. a power line 51 and a grounding line 52, or light source elements 70 arranged in a plurality of lines or rows may share the power line 21 and the grounding line 52.

In the exemplary embodiment of a backlight unit 1000 including the light source unit 100 having the above configuration, the light source unit 100 is attached to the lower receiving member 400 by the heat-radiating adhesive 150 and only the conductive pads 20, the first base film 10, and the heat-radiating adhesive 150 are disposed between the light source unit 100 and the lower receiving member 400. Therefore, the distance between the light source unit 100 and the lower receiving member 400 is reduced as compared with the related art, such that it is possible to improve efficiency of heat removal from the light source elements 70. Furthermore, the heat from the light source elements 70 is smoothly transferred to the lower receiving member 400 by the heat-radiating adhesive 150; therefore, it is possible to improve the efficiency of heat removal from the light source elements 70.

Although the present invention has been described in connection with the exemplary embodiments of the present invention, it will be apparent to those skilled in the art that various modifications and changes may be made thereto without departing from the scope and spirit of the invention.

What is claimed is:

1. A light source unit comprising:
a first base layer;
a plurality of conductive pads disposed on the first base layer;
a second base layer disposed on the first base layer and including a plurality of openings therein exposing the plurality of conductive pads;
a wiring portion disposed directly on the second base layer; and
a plurality of light source elements disposed on the plurality of conductive pads exposed by the plurality of openings in the second base layer.

2. The light source unit of claim 1, further comprising:
a first passivation layer disposed on the first base layer; and
a second passivation layer disposed on the second base layer.

3. The light source unit of claim 1, wherein the wiring portion includes at least one power line configured to supply power to the plurality of light source elements.

4. The light source unit of claim 3, wherein the wiring portion further includes at least one grounding line configured to connect the plurality of light source elements with at least one grounding terminal.

5. The light source unit of claim 4, wherein each of the conductive pads has a width larger than a width of the at least one grounding line and the at least one grounding line has a width larger than the at least one power line.

6. The light source unit of claim 5, further comprising:
a plurality of first connecting lines extending from a first group of conductive pads; and
a plurality of second connecting lines extending from a second group of conductive pads.

7. The light source unit of claim 6, further comprising:
a plurality of first via holes formed through the second base layer, wherein the first via holes are filled with a conductive material and connect the plurality of first connecting lines with the at least one power line; and
a plurality of second via holes formed through the second base layer, wherein the second via holes are filled with a conductive material and connect the plurality of second connecting lines with the at least one grounding line.

8. The light source unit of claim 5, further comprising:
a plurality of first via holes formed through the second base layer, wherein the first via holes are filled with a conductive material and connect a conductive pad with the at least one power line; and
a plurality of second via holes formed through the second base layer, wherein the second via holes are filled with a conductive material and connect another conductive pad with the at least one grounding line.

9. The light source unit of claim 1, further comprising:
at least one heat release pad disposed on the lower side of the conductive pad.

10. A method of manufacturing a light source unit, comprising:
disposing a plurality of conductive pads on a first base layer;
disposing a plurality of light source elements on the plurality of conductive pads;
disposing a second base layer on the first base layer; and
disposing a wiring portion on the second base layer,
wherein the plurality of conductive pads are exposed through the second base layer.

11. The method of claim 10, wherein regions of the second base layer corresponding to the light source elements are removed.

12. The method of claim 10, wherein regions of the second base layer corresponding to the width of the light source elements are entirely removed.

13. The method of claim 12, further comprising:
disposing a passivation layer on the second base layer, wherein the passivation layer is not disposed on the plurality of light source elements.

14. A display device comprising:
a display panel;
a light source unit configured to provide a light to the display panel, the light source unit comprising:
a first base layer;
a plurality of conductive pads disposed on the first base layer;
a second base layer disposed on the first base layer and including a plurality of openings therein exposing the plurality of conductive pads;
a wiring portion disposed directly on the first base layer; and
a plurality of light source elements disposed on the plurality of conductive pads; and
a receiving member wherein the light source unit is fixed.

15. The display device of claim 14, wherein the wiring portion includes:
at least one power line configured to apply power to the plurality of light source elements; and
at least one grounding line configured to connect the plurality of light source elements with at least one grounding terminal.

16. The display device of claim 15, wherein each of the plurality of conductive pads has a width larger than the at least one grounding line and the at least one grounding line has a width larger than the at least one power line.

17. The display device of claim 16, further comprising:
a plurality of first connecting lines extending from a first group of the plurality of conductive pads;
a plurality of second connecting lines extending from a second group of the plurality of conductive pads;
a plurality of first via holes formed through the second base layer, wherein the first via holes are filled with a conductive material and connect the plurality of first connecting lines with the at least one power line; and
a plurality of second via holes formed through the second base layer, wherein the second via holes are filled with a conductive material and connect the plurality of second connecting lines with the at least one grounding line.

18. The display device of claim 16, further comprising:
a plurality of first via holes formed through the second base layer, wherein the first via holes are filled with a conductive material and connect a first group of conductive pads with the at least one power line; and
a plurality of second via holes formed through the second base layer, wherein the second via holes are filled with a conductive material and connect a second group of conductive pads with the at least one grounding line.

19. The display device of claim 14, further comprising:
a heat-radiating adhesive configured to attach the light source unit to the receiving member.

20. The display device of claim 19, wherein the heat-radiating adhesive includes a thermosetting material configured to maintain adhesiveness at a temperature corresponding to an operating temperature of the light source elements.

21. The display device of claim 19, wherein the light source unit is attached on an inside of a side wall of the receiving member.

22. The display device of claim 21, further comprising:
a light guide plate including a first side in contact with a side of the light source unit.

23. The display device of claim 19, wherein the light source unit is attached to an interior bottom side of the receiving member.

* * * * *